(12) United States Patent
Kim et al.

(10) Patent No.: US 8,154,097 B2
(45) Date of Patent: Apr. 10, 2012

(54) IMAGE SENSOR AND METHOD OF MANUFACTURING THE SAME

(75) Inventors: Hong-Ki Kim, Hwaseong-Si (KR); Duck-Hyung Lee, Seongnam-Si (KR); Hyun-Pil Noh, Seongnam-Si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 415 days.

(21) Appl. No.: 12/266,856

(22) Filed: Nov. 7, 2008

(65) Prior Publication Data

US 2009/0206432 A1    Aug. 20, 2009

(51) Int. Cl.
*H01L 31/09* (2006.01)

(52) U.S. Cl. ........ 257/432; 257/440; 257/443; 257/444; 257/E27.133; 438/57; 438/60; 438/74; 438/75

(58) Field of Classification Search .................. 257/440, 257/443, 444, 445, 446, 758, E21.249, E31.11, 257/E31.127, 431, 432, E27.133; 438/57, 438/60, 73, 74, 75, 78, 79
See application file for complete search history.

(56) References Cited

U.S. PATENT DOCUMENTS

2006/0011813 A1* 1/2006 Park et al. ................. 250/208.1
2006/0220025 A1* 10/2006 Oh ................................. 257/72

FOREIGN PATENT DOCUMENTS

| KR | 1020060097878 | 9/2006 |
| KR | 100660329 | 12/2006 |
| KR | 100672690 | 1/2007 |
| KR | 100731128 | 6/2007 |

* cited by examiner

*Primary Examiner* — Ha Tran T Nguyen
*Assistant Examiner* — Suberr Chi
(74) *Attorney, Agent, or Firm* — F. Chau & Associates, LLC

(57) ABSTRACT

An image sensor and a method of manufacturing the same are provided. The image sensor includes a substrate having a sensor array area and a peripheral circuit area a first insulating film structure formed on the peripheral circuit area and including a plurality of first multi-layer wiring lines and a second insulating film structure formed on the sensor array area and including a plurality of second multi-layer wiring lines. The uppermost-layer wiring line of the plurality of first multi-layer wiring lines is higher than that of the uppermost-layer wiring line of the plurality of second multi-layer wiring lines. The first insulating film structure includes an isotropic etch-stop layer, and the second insulating film structure does not include the isotropic etch-stop layer.

14 Claims, 15 Drawing Sheets

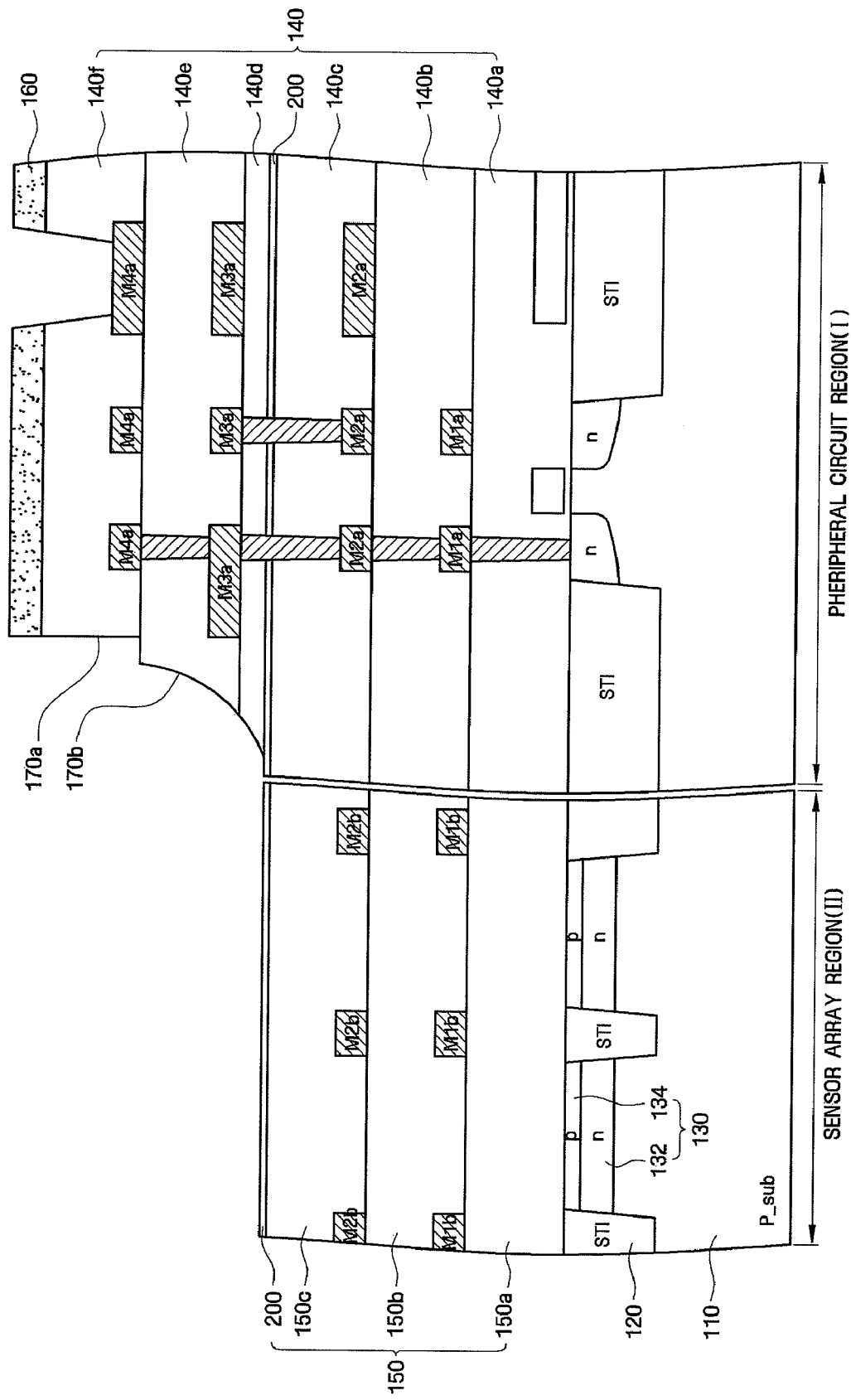

IMAGE SENSOR AND METHOD OF MANUFACTURING THE SAME

CROSS REFERENCE TO RELATED APPLICATION

This application claims priority from Korean Patent Application No. 10-2008-0014038 filed on Feb. 15, 2008, the disclosure of which is hereby incorporated by reference herein in its entirety.

BACKGROUND OF THE INVENTION

1. Technical Field

The present disclosure relates to an image sensor and a method of manufacturing the same.

2. Description of the Related Art

Image sensors may convert optical images into electric signals. In recent years, with the development of computer industry and communication industry, the demand for image sensors with advanced performance has increased in various fields, such as digital cameras, camcorders, PCSs (personal communication systems), game machines, security cameras, and medical micro cameras.

In particular, metal oxide semiconductors (MOS) image sensors may be easy to operate and may be implemented by various scanning methods. In addition, a signal processing circuit provided therein may be integrated into a single chip, which makes it possible to reduce the size of the MOS image sensors. Further, the MOS image sensor can be manufactured by MOS technology, which may lower the manufacturing cost. The MOS image sensor may have low power consumption, and may be used in products having limited battery capacity. Therefore, the development of the MOS image sensor makes it possible to improve the resolution. For at least the above reasons, the demand for the image sensor has rapidly increased.

The MOS image sensor may be divided into a sensor array region having a plurality of unit pixels formed therein and a peripheral circuit region having circuits for controlling/driving the plurality of unit pixels formed therein. The sensor array region may include photoelectric conversion elements and a plurality of MOS transistors, and the peripheral circuit region may include a plurality of MOS transistors. The sensor array region and the peripheral circuit region may be integrated into one substrate, and the MOS transistors in the sensor array region and the peripheral circuit region may be formed at the same time.

Recently, with an increase in the number of wiring layers in the peripheral circuit region, the difference between the number of wiring layers in the sensor array region and the number of wiring layers in the peripheral circuit region has also increased. For example, four or more wiring layers may be formed in the sensor array region, and two or more wiring layers may be formed in the peripheral circuit region. Even though two wiring layers are formed in the sensor array region, four or more interlayer insulating films may be formed in the sensor array region. When a thick film is formed on the photoelectric conversion element, the intensity of light incident on the photoelectric conversion element may be lowered, which may deteriorate various optical characteristics.

SUMMARY OF THE INVENTION

Exemplary embodiments of the present invention may provide an image sensor with improved optical characteristics.

Exemplary embodiments of the present invention may also provide a method of manufacturing an image sensor with improved optical characteristics.

In accordance with an exemplary embodiment of the present invention, an image sensor is provided. The image sensor includes a substrate having a sensor array region and a peripheral circuit region, a first insulating film structure formed on the peripheral circuit region and including a plurality of first multi-layer wiring lines and a second insulating film structure formed on the sensor array region and including a plurality of second multi-layer wiring lines. The uppermost-layer wiring line of the plurality of first multi-layer wiring lines is higher than that of the uppermost-layer wiring line of the plurality of second multi-layer wiring lines. The first insulating film structure includes an isotropic etch-stop layer, and the second insulating film structure does not include the isotropic etch-stop layer.

In accordance with an exemplary embodiment of the invention, an image sensor is provided. The image sensor includes a substrate having a sensor array region and a peripheral circuit region, a first insulating film structure formed on the peripheral circuit region and including a plurality of first multi-layer wiring lines and a second insulating film structure formed on the sensor array region and including a plurality of second multi-layer wiring lines. A first upper surface of the first insulating film structure is higher than a second upper surface of the second insulating film structure, and at least a portion of a connecting surface that connects the first upper surface and the second upper surface has an isotropic etching profile.

In accordance with another exemplary embodiment of the invention, a method of manufacturing an image sensor is provided. The method includes defining a substrate into a sensor array region and a peripheral circuit region, forming a first insulating film structure including a plurality of multi-layer wiring lines and an isotropic etch-stop layer on the peripheral circuit region, and forming a second insulating film structure including a plurality of multi-layer wiring lines and an isotropic etch-stop layer on the sensor array region. The method further includes performing an etching process using the isotropic etch-stop layer such that an upper surface of the second insulating film structure on the sensor array region is lower than an upper surface of the first insulating film structure on the peripheral circuit region and removing the isotropic etch-stop layer on the sensor array region.

BRIEF DESCRIPTION OF THE DRAWINGS

Exemplary embodiments of the present invention can be understood in more detail from the following description taken in conjunction with the attached drawings, in which:

FIGS. 6A to 6D are cross-sectional views illustrating intermediate processes of a method of manufacturing an image sensor according to an exemplary embodiment of the present invention;

DETAILED DESCRIPTION OF THE EXEMPLARY EMBODIMENTS OF THE INVENTION

The present invention may, however, be embodied in many different forms and should not be construed as being limited to the embodiments set forth herein. In the exemplary embodiments of the present invention, detailed description of known device structures and techniques incorporated herein will be omitted when it may make the subject matter of the present invention unclear.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 1:
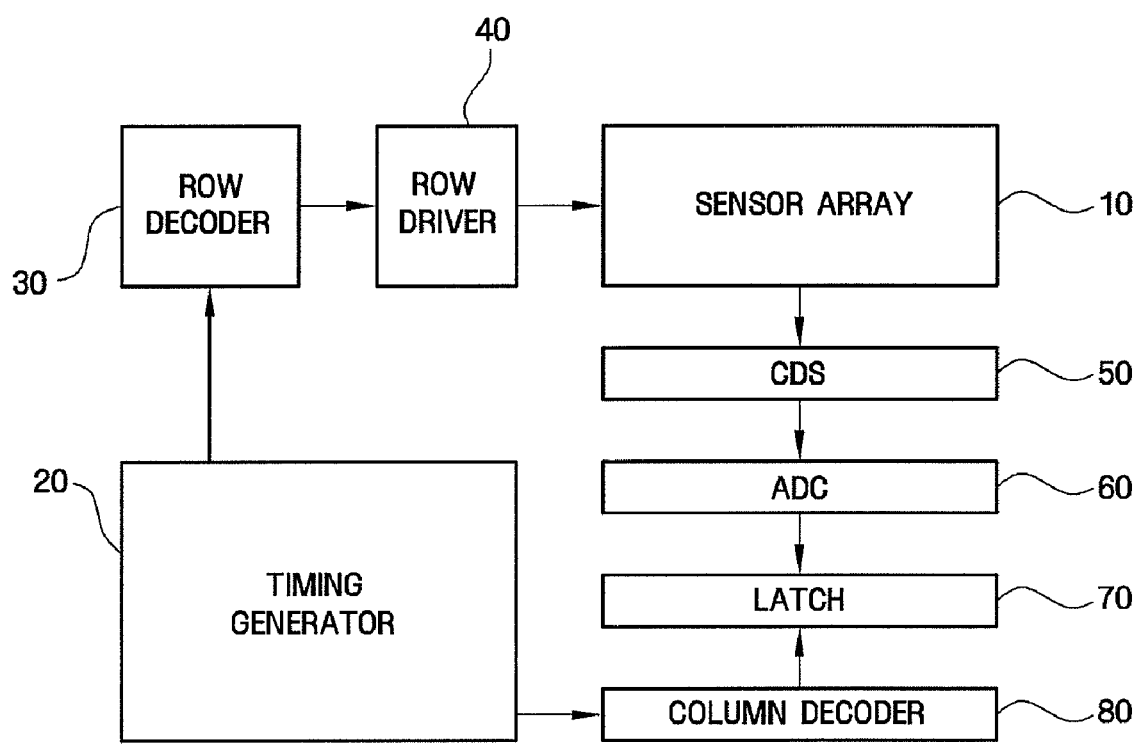
FIG. 1 is a block diagram illustrating the configuration of an image sensor according to an exemplary embodiment of the present invention.

FIG. 1 is a block diagram illustrating an image sensor according to an exemplary embodiment of the present invention.

Referring to FIG. 1, the image sensor according to an exemplary embodiment of the present invention includes a sensor array 10 in which pixels, each having a photoelectric conversion element, are two-dimensionally arranged, a timing generator 20, a row decoder 30, a row driver 40, a correlated double sampler (CDS) 50, an analog-to-digital converter (ADC) 60, a latch 70, and a column decoder 80.

The sensor array 10 includes a plurality of unit pixels that are two-dimensionally arranged. The plurality of unit pixels convert an optical image into electric output signals. The sensor array 10 is driven in response to a plurality of driving signals received from the row driver 40, such as row selection signals, reset signals, and charge transmission signals. The converted electric output signals are transmitted to the correlated double sampler 50 through vertical signal lines.

The timing generator 20 provides timing signals and control signals to the row decoder 30 and the column decoder 80.

The row driver 40 provides a plurality of driving signals for driving a plurality of unit pixels to the active pixel sensor array 10 according to the decoded result by the row decoder 30. In general, when the unit pixels are arranged in a matrix, the row decoder provides the driving signals to each row.

The correlated double sampler 50 receives output signals from the active pixel sensor array 10 through the vertical signal lines, and holds and samples the received signals. That is, the correlated double sampler 50 performs double sampling on a specific noise level and the signal level of the output signal, and outputs a difference level between the noise level and the signal level.

The analog-to-digital converter 60 converts an analog signal corresponding to the difference level into a digital signal, and outputs the converted signal.

The latch 70 latches the digital signal, and sequentially outputs the latched signals to an image signal processor according to the decoded result by the column decoder 80.

Figure 2:
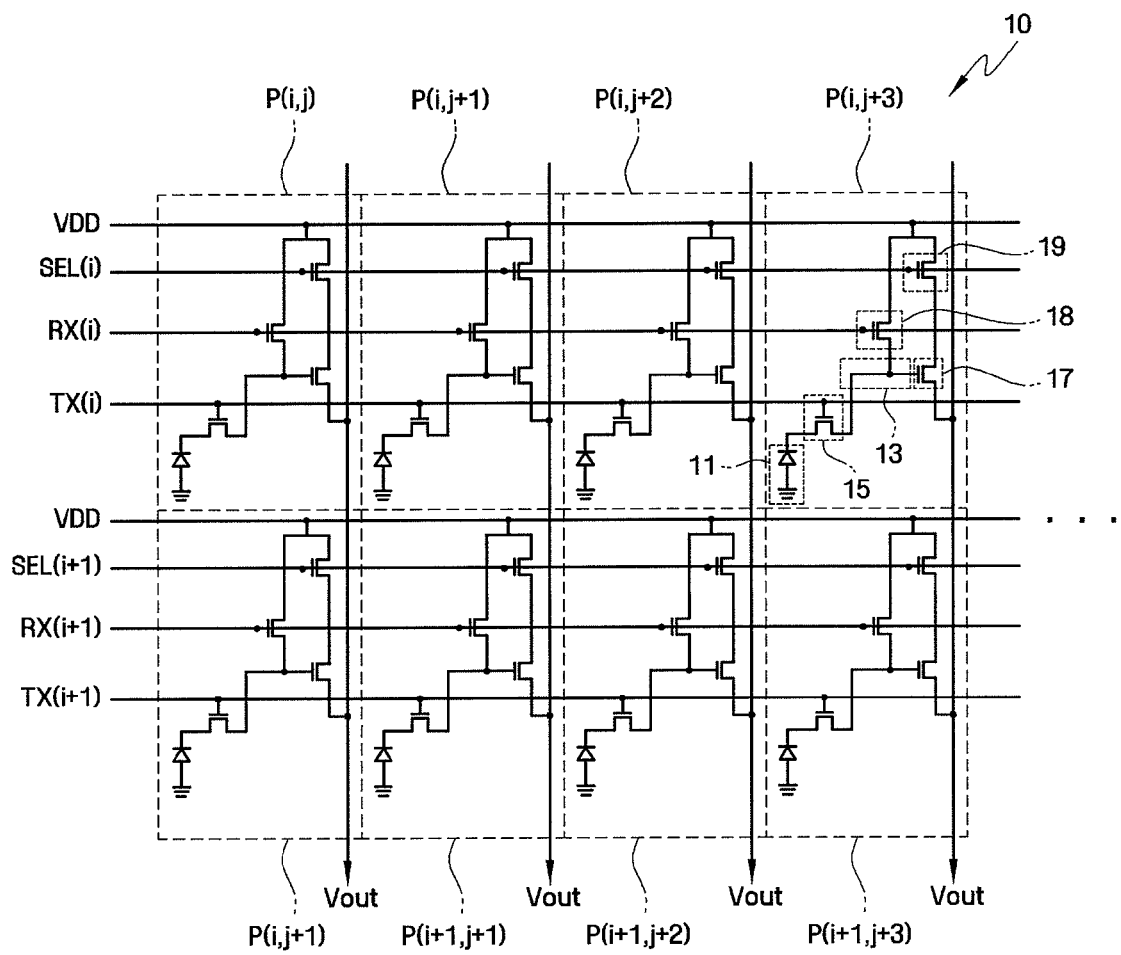
FIG. 2 is an equivalent circuit diagram illustrating a sensor array shown in FIG. 1.

FIG. 2 is an equivalent circuit diagram of the sensor array shown in FIG. 1.

Referring to FIG. 2, pixels P are arranged in a matrix to form the sensor array 10. Each of the pixels P includes a photoelectric conversion element 11, a floating diffusion region 13, a charge transmitting element 15, a drive element 17, a reset element 18, and a selecting element 19. For the functions of the elements will be described with reference to an i-th row of pixels (P(i, j), P(i, j+1), P(i, j+2), P(i, j+3), . . . ).

The photoelectric conversion element 11 receives incident light and stores charge corresponding to the quantity of light. The photoelectric conversion element 11 may be, for example, a photo diode, a photo transistor, a photo gate, a pinned photo diode, or a combination thereof. In the drawings, the photo diode is exemplified as the photoelectric conversion element.

Each of the photoelectric conversion elements 11 is coupled to the corresponding charge transmitting element 15 that transmits the stored charge to the floating diffusion region 13. The floating diffusion (FD) region 13 converts the charge into a voltage and has parasitic capacitance. Therefore, charge is accumulatively stored in the floating diffusion region.

The drive element 17 shown as a source follower amplifier amplifies a variation in the electrical potential of the floating diffusion region 13 that receives the storage charge from the corresponding photoelectric conversion element 11, and outputs the amplified result to an output line Vout.

The reset element 18 periodically resets the floating diffusion region 13. The reset element 18 may be composed of one MOS transistor that is driven by a predetermined bias (that is, a reset signal) supplied through a reset line RX(i). When the reset element 18 is turned on by the bias supplied through the reset line RX(i), a predetermined electrical potential, for example, a power supply voltage VDD supplied to the drain of the reset element 18 is transmitted to the floating diffusion region 13.

The selecting element 19 selects each row of pixels P to be read. The selecting element 19 may be composed of one MOS transistor that is driven by a bias (that is, a row selection signal) supplied through a row selection line SEL(i). When the selecting element 19 is turned on by the bias supplied through the row selection line SEL(i), a predetermined electrical potential, for example, a power supply voltage VDD supplied to the drain of the selecting element 19 is transmitted to the drain region of the drive element 17.

A transmission line TX(i) through which the bias is applied to the charge transmitting element 15, the reset line RX(i) through which the bias is applied to the reset element 18, and the row selection line SEL(i) through which the bias is applied to the selecting element 19 may be arranged so as to extend substantially in parallel to the row direction.

Figure 3:
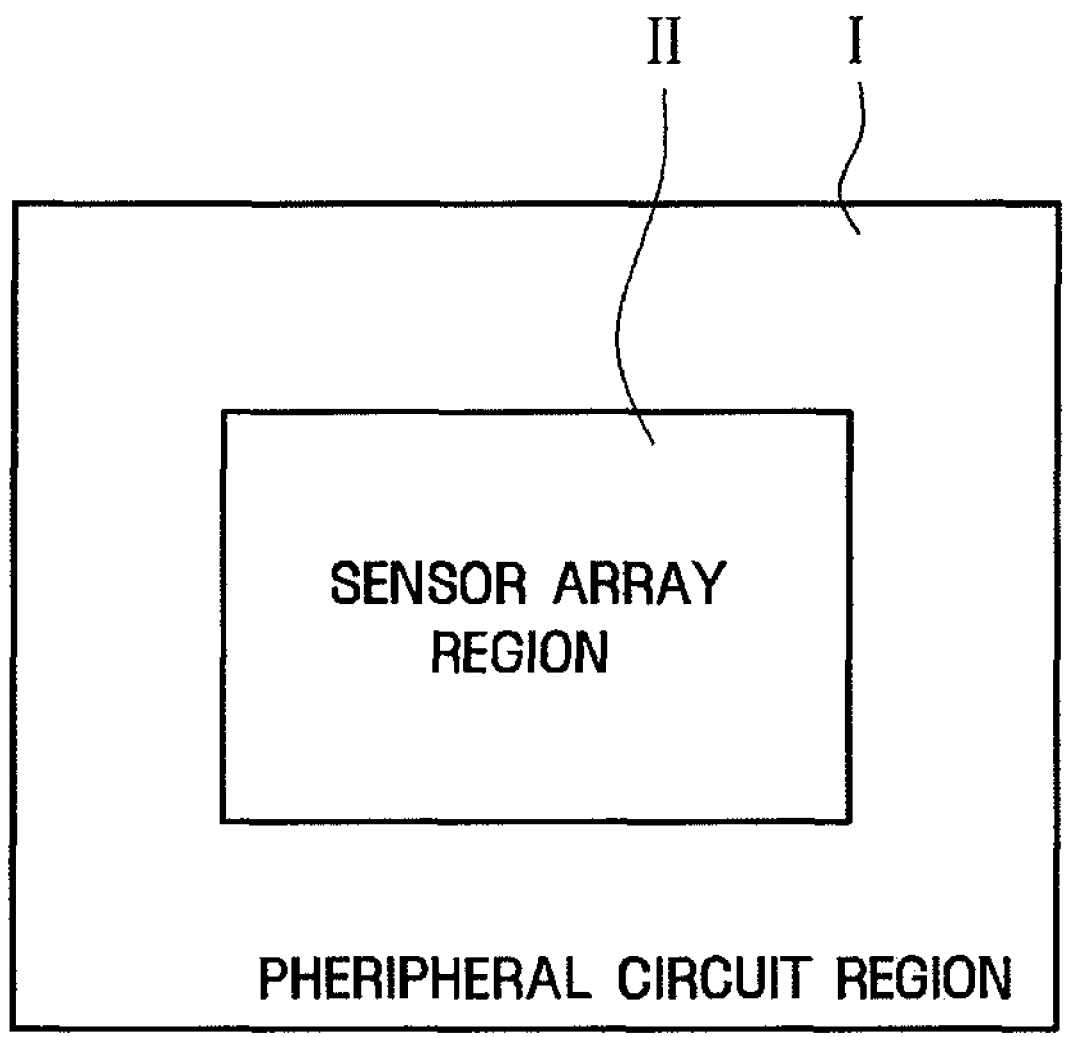
FIGS. 3 and 4 are a conceptual view and a cross-sectional view illustrating an image sensor according to an exemplary embodiment of the present invention, respectively.
Figure 4:
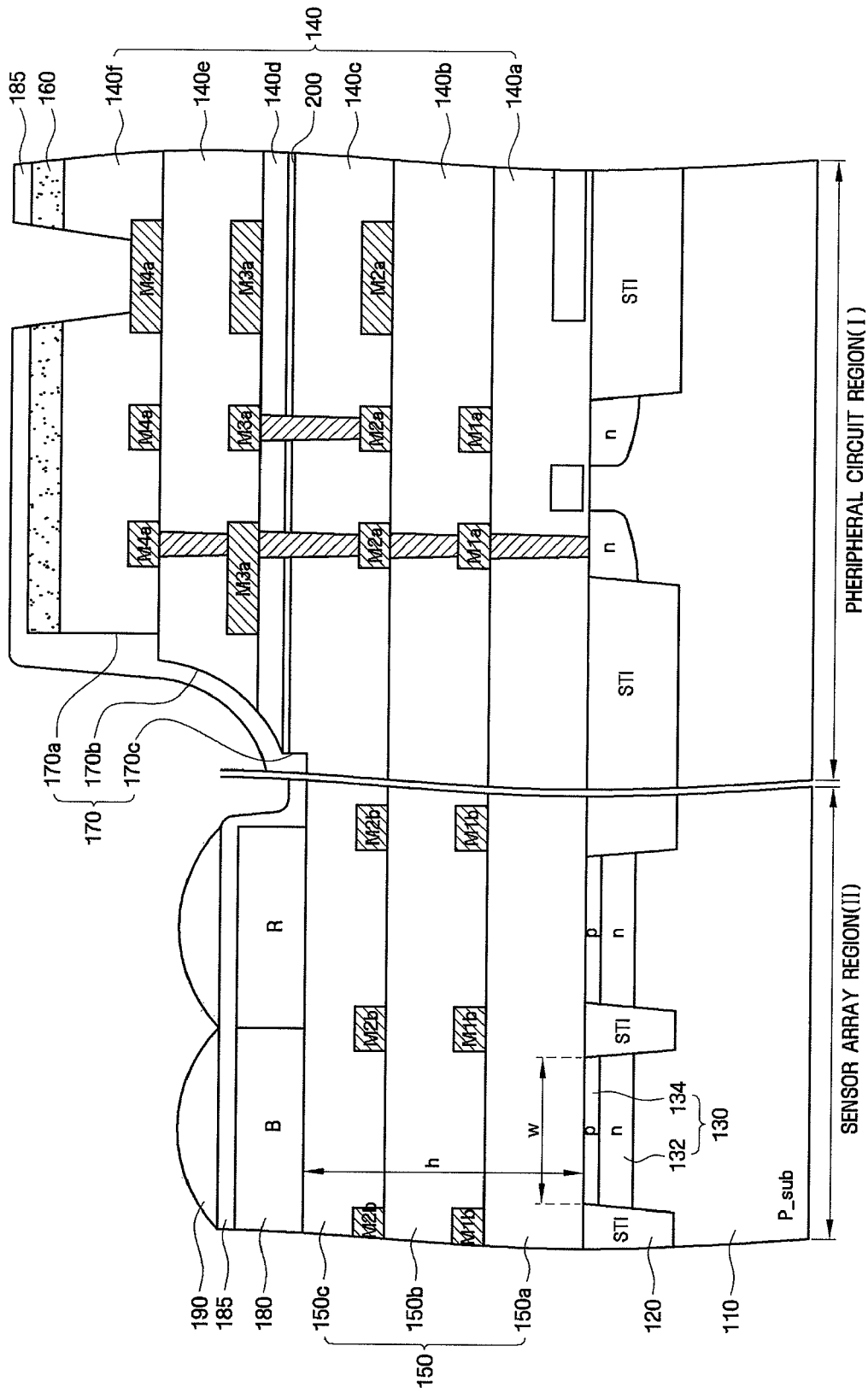

FIGS. 3 and 4 are a conceptual view and a cross-sectional view illustrating an image sensor according to an exemplary embodiment of the invention, respectively. For clarity of description, FIG. 4 shows a portion of the sensor array region and a portion of the peripheral circuit region, and mainly shows the photoelectric conversion element in the sensor array region.

First, referring to FIG. 3, a peripheral circuit region I may include, for example, the correlated double sampler 50, the analog-to-digital converter 60, and the latch 70 shown in FIG. 1, and a sensor array region II may include the sensor array 10 shown in FIG. 1. As shown in FIG. 3, the peripheral circuit region I may be formed so as to surround the sensor array region II, but the exemplary embodiments of the invention are not limited thereto.

Referring to FIG. 4, an element isolation area 120, such as shallow trench isolation (STI), is formed in a substrate 110, and an active area is defined by the element isolation area 120. The active area is mainly divided into the peripheral circuit region I and the sensor array region II. The substrate 110 may be formed of, for example, a first conductive (for example, a p-type) substrate. In addition, an epitaxial layer may be formed on the substrate 110, or a plurality of wells may be formed in the substrate 110.

A first insulating film structure 140 may be formed on the peripheral circuit region I, and a second insulating film structure 150 may be formed on the sensor array region II.

The first insulating film structure 140 and the second insulating film structure 150 may have different heights.

The first insulating film structure 140 may include first multi-layer wiring lines M1a, M2a, M3a, and M4a, a plurality of vias (for example, 141) that electrically connect the first multi-layer wiring lines M1a, M2a, M3a, and M4a, and a plurality of interlayer insulating films 140a, 140b, 140c, 140d, 140e, and 140f. The second insulating film structure 150 may include second multi-layer wiring lines M1b and M2b, a plurality of vias that electrically connect the second multi-layer wiring lines M1b and M2b, and a plurality of interlayer insulating films 150a, 150b, and 150c. In this exemplary embodiment, the first multi-layer wiring lines M1a, M2a, M3a, and M4a and the second multi-layer wiring lines M1b and M2b may be formed of aluminum, but the exemplary embodiments of the invention are not limited thereto.

Among the first multi-layer wiring lines M1a, M2a, M3a, and M4a, the uppermost-layer wiring line M4a is higher than the uppermost-layer wiring line M2b of the second multi-layer wiring lines M1b and M2b. In FIG. 4, the first multi-layer wiring lines M1a, M2a, M3a, and M4a include four-layer wiring lines and the second multi-layer wiring lines M1b and M2b include two-layer wiring lines. However, the exemplary embodiments of the invention are not limited thereto.

The first upper surface of the first insulating film structure 140 (that is, an upper surface of the interlayer insulating film 140f) may be higher than the second upper surface of the second insulating film structure 150 (that is, an upper surface of the interlayer insulating film 150c).

For example, according to an exemplary embodiment of the invention, the first insulating film structure 140 may include an isotropic etch-stop layer 200, but the second insulating film structure 150 may not include the isotropic etch-stop layer 200. The isotropic etch-stop layer 200 is used to etch/remove unnecessary interlayer insulating films formed on the sensor array region II using isotropic etching. That is, the isotropic etch-stop layer 200 is used to remove the interlayer insulating film in the sensor array region II that is higher than the uppermost-layer wiring line M2b of the second multi-layer wiring lines M1b and M2b. Therefore, the isotropic etch-stop layer 200 may be arranged at a position that is higher than the uppermost-layer wiring line M2b of the second multi-layer wiring lines M1b and M2b.

The reason why unnecessary interlayer insulating films in the sensor array region II are etched and removed by isotropic etching is as follows.

It is possible to reduce the aspect ratio r of the unit pixel. The aspect ratio r can be defined by various methods. However, in this exemplary embodiment, the aspect ratio r is defined as the ratio of the height h of the second insulating film structure 150 to the width w of the photoelectric conversion element 130 (that is, r=h/w). When unnecessary interlayer insulating films are removed from the sensor array region II, the height h decreases, and the aspect ratio r may be lowered. When the aspect ratio r is lowered, the quantity of light incident on the photoelectric conversion element 130 may increase, which in turn may result in an increase in the sensitivity of the image sensor.

In addition, among various optical characteristics, particularly, an RI (relative intensity) value may increase. The RI value is an index indicating the ratio of the sensitivity of the unit pixel in a central region of the sensor array region II to the sensitivity of the unit pixel in the outermost region. As the RI value increases, the sensitivity of the unit pixel in the sensor array region II may become constant regardless of the position of the unit pixel. To increase the RI value, an oblique optical path of light incident on the unit pixels in the outermost region should be shortened. One of the best ways to shorten the oblique optical path is to decrease the height h. Therefore, when the method according to this embodiment is used to decrease the height h, the RI value may increase.

However, when unnecessary interlayer insulating films are removed from the sensor array region II by anisotropic etching, a variation in the height h may increase. As the quantity of light incident on the photoelectric conversion element 130 depends on the height h, the sensitivity of the image sensor varies. As a result, the RI value may decrease.

In addition, the image sensor may be damaged by plasma during the anisotropic etching, which may result in an increase in dark current. For example, the plasma may cause a positive charge to be stored in the gate of the transmission element (see reference numeral 15 in FIG. 2), and the positive charge may cause a negative charge to be stored in the channel area of the transmission element 15 (that is, electron accumulation occurs).

As in the present exemplary embodiment of the invention, when unnecessary interlayer insulating films are removed from the sensor array region II by isotropic etching, it is possible to reduce the damage of the image sensor due to the plasma, and considerably decrease the variation in the height h, which may result in an increase in the RI value. Therefore, it is possible to improve the optical characteristics of an image sensor.

Further, as shown in FIG. 4, the isotropic etch-stop layer 200 may be formed between the second-layer wiring lines M2a and the third-layer wiring lines M3a among the first multi-layer wiring lines M1a, M2a, M3a, and M4a, but the exemplary embodiments of the invention are not limited thereto. The isotropic etch-stop layer 200 may be arranged at any position as long as it is higher than the uppermost-layer wiring line M2b of the second multi-layer wiring lines M1b and M2b. For example, the isotropic etch-stop layer 200 may be formed between the third-layer wiring lines M3a and the fourth-layer wiring lines M4a among the first multi-layer wiring lines M1a, M2a, M3a, and M4a. As the amount of unnecessary interlayer insulating films removed from the sensor array region II increases, the quantity of light incident on the photoelectric conversion element 130 may increase. Therefore, it is preferable that the isotropic etch-stop layer 200 be arranged as close to the uppermost-layer wiring line M2b of the second multi-layer wiring lines M1b and M2b as possible.

Furthermore, as shown in FIG. 4, the isotropic etch-stop layer 200 may be formed so as not to contact the second-layer wiring lines M2a and the third-layer wiring lines M3a. For example, the lower interlayer insulating film 140c and the upper interlayer insulating film 140d are arranged between the second-layer wiring lines M2a and the third-layer wiring lines M3a, and the isotropic etch-stop layer 200 is arranged between the lower interlayer insulating film 140c and the upper interlayer insulating film 140d.

For example, the upper interlayer insulating film 140d functions to protect the isotropic etch-stop layer 200. The upper interlayer insulating film 140d prevents the isotropic etch-stop layer 200 from being removed or damaged during an etching process of forming the vias 141 and an etching process of forming the third-layer wiring lines M3a. If the upper interlayer insulating film 140d is not provided, the isotropic etch-stop layer 200 may be removed or damaged by the etching processes. When the isotropic etch-stop layer 200 is damaged, it may be difficult to use isotropic etching during a subsequent process of removing unnecessary interlayer insulating films from the sensor array region I. Considering that a portion of the upper interlayer insulating film 140d is etched by the etching process of forming the vias 141 and the etching process of forming the third-layer wiring lines M3a, the upper interlayer insulating film 140d may have a thickness of, for example, about 1500 to 2500 Å. It will be understood by those skilled in the art that the thickness of the upper interlayer insulating film 140d may depend on the design of an image sensor.

The isotropic etch-stop layer 200 may be formed of a material having etching selectivity with respect to the interlayer insulating films 140d, 140e, and 140f. For example, when the interlayer insulating films 140d, 140e, and 140f are oxide films, the isotropic etch-stop layer 200 may be a nitride film (for example, PSiN). That is, the interlayer insulating films 140d, 140e, and 140f may be formed of any material as long as the material has etching resistance to an oxide film etchant (for example, LAL). In addition, when the first multi-layer wiring lines M1a, M2a, M3a, and M4a and the second multi-layer wiring lines M1b and M2b are formed of aluminum, the isotropic etch-stop layer 200 may be made of a material that is formed by, for example, a CVD (chemical vapor deposition) method or an ALD (atomic layer deposition) method not using a high temperature. This is because stress may be applied to the first multi-layer wiring lines M1a, M2a, M3a, and M4a and the second multi-layer wiring lines M1b and M2b (that is, aluminum) when the isotropic etch-stop layer 200 is formed at a high temperature.

The thickness of the isotropic etch-stop layer 200 may be in a range of, for example, about 300 to 1500 Å, but the exemplary embodiments of the invention are not limited thereto. The thickness of the isotropic etch-stop layer 200 may vary according to the design of the image sensor.

The vias 141 that connect the second-layer wiring lines M2a and the third-layer wiring lines M3a may be formed so as to pass through the isotropic etch-stop layer 200, as shown in FIG. 4.

Meanwhile, as the first upper surface of the first insulating film structure 140 (that is, the upper surface of the interlayer insulating film 140f) is higher than the second upper surface of the second insulating film structure 150 (that is, the upper surface of the interlayer insulating film 150c), the image sensor according to the present exemplary embodiment of the invention is provided with a connecting surface 170 that connects the first upper surface and the second upper surface.

For example, in the image sensor according to the present exemplary embodiment of the invention, at least a portion of the connecting surface 170 has an isotropic etching profile. This is because isotropic etching is used to remove unnecessary interlayer insulating films from the sensor array region II, as described above.

Specifically, for example, the entire connecting surface 170 may have an isotropic etching profile. Alternatively, a portion of the connecting surface 170 may have an isotropic etching profile, and the other portion thereof may have an anisotropic etching profile. For example, as shown in FIG. 4, the connecting surface 170 may include a first portion 170a that contacts the first upper surface, a second portion 170c that contacts the second upper surface, and a third portion 170b that is provided between the first portion 170a and the second portion 170c. The first portion 170a and the second portion 170c may have anisotropic etching profiles, and the third portion 170b may have an isotropic etching profile. Also, only the first portion 170a may have an anisotropic etching profile, or only the second portion 170c may have an anisotropic etching profile.

In present exemplary embodiment, a connecting portion between the first portion 170a and the third portion 170c is shown in a step shape (or a projection shape), but the exemplary embodiments of the invention are not limited thereto.

Meanwhile, a passivation layer 160 may be formed on the first upper surface of the first insulating film structure 140, and color filters 180, a planarizing film 185, and micro lenses 190 may be sequentially formed on the second upper surface of the second insulating film structure 150. The color filter 180 and the micro lens 190 are formed in a region corresponding to each of the photoelectric conversion elements 130. The photoelectric conversion element 130 shown in FIG. 4 is a pinned photo diode, and may include a second conductive (for example, an n-type) doping area 132 and a first conductive (for example, a p-type) doping area 134. The photoelectric conversion element 130 is frequently used for the sensor array to reduce a dark current and noise due to the dark current.

Briefly, in the present exemplary embodiment of the invention, the isotropic etch-stop layer 200 is included in the first insulating film structure 140, but is not included in the second insulating film structure 150. The isotropic etch-stop layer 200 may be formed between n-th (n is a natural number greater than 1) layer wiring lines and (n+1)-th layer wiring lines such that it does not contact the n-th layer wiring lines and the (n+1)-th layer wiring lines.

Read elements (for example, the charge transmitting element, the drive element, the reset element, and the selecting element) may be formed in the sensor array region II, and CMOS elements, resistors, and capacitors may be formed simultaneously with the read elements in the peripheral circuit region I. These elements may be implemented by various methods that have been known to those skilled in the art.

Figure 5:
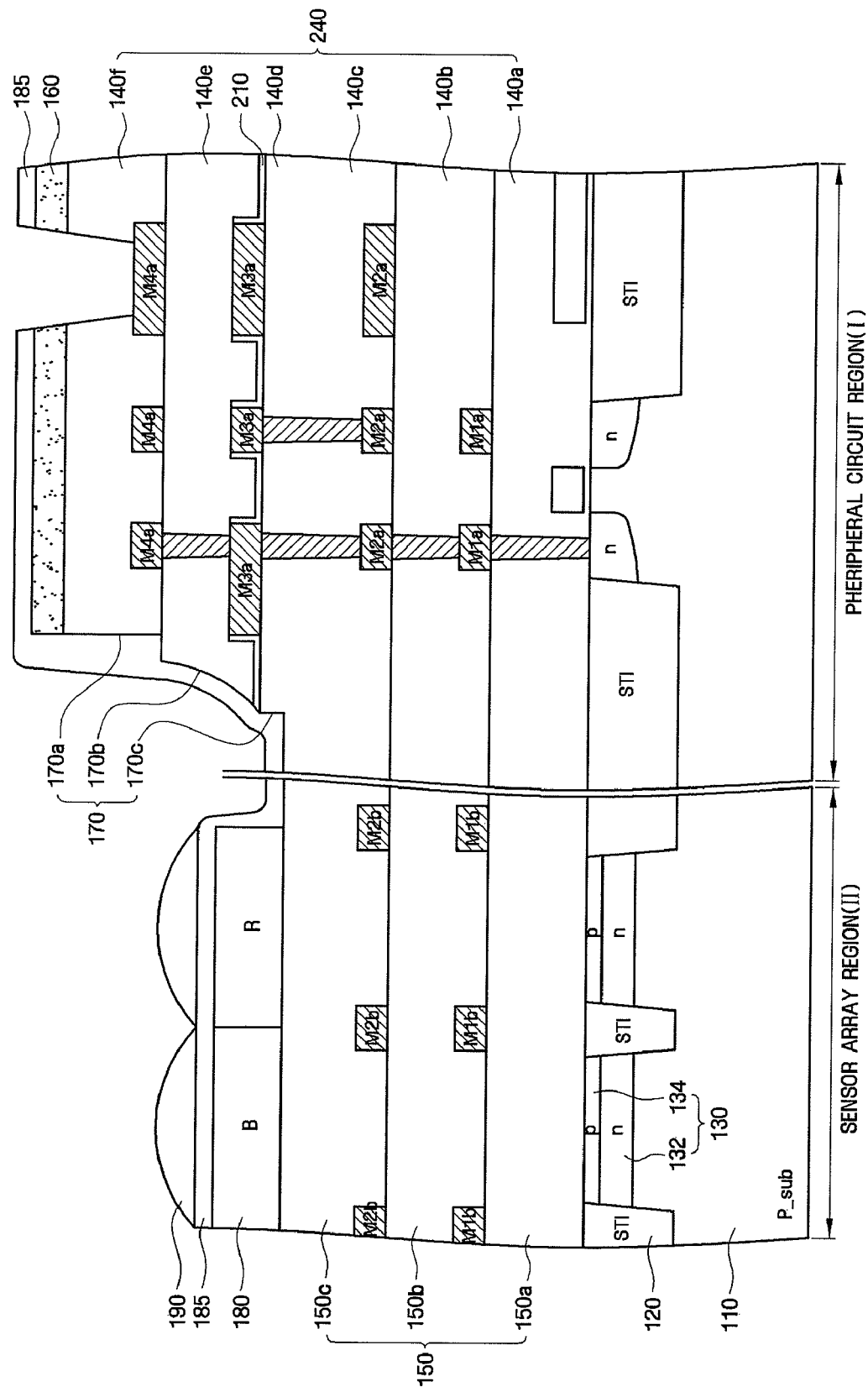
FIG. 5 is a cross-sectional view illustrating an image sensor according to an exemplary embodiment of the present invention.

FIG. 5 is a cross-sectional view illustrating an image sensor according to another exemplary embodiment of the invention.

Another embodiment shown in FIG. 5 differs from the above-described embodiment shown in FIG. 4 in that an isotropic etch-stop layer 210 is formed between the third-layer wiring lines M3a and the fourth-layer wiring lines M4a and the isotropic etch-stop layer 210 contacts the third-layer wiring lines M3a. Specifically, the isotropic etch-stop layer 210 may be formed on the upper surface of the interlayer insulating film 140c and the side surfaces of the third-layer wiring lines M3a.

The isotropic etch-stop layer 210 shown in FIG. 5 is distant from the uppermost-layer wiring lines M2b of the second multi-layer wiring lines M1b and M2b, as compared to the isotropic etch-stop layer 200 shown in FIG. 4. Therefore, in the present exemplary embodiment shown in FIG. 5, the height of the second insulating film structure 150 may be higher than that in the embodiment shown in FIG. 4, and the RI value may be smaller than that in the exemplary embodiment shown in FIG. 4.

Next, a method of manufacturing an image sensor according to an embodiment of the invention will be described with reference to FIG. 2 and FIGS. 6A to 6D. FIGS. 6A to 6D are cross-sectional views illustrating intermediate processes of the method of manufacturing the image sensor according to an exemplary embodiment of the invention.

Figure 6A:
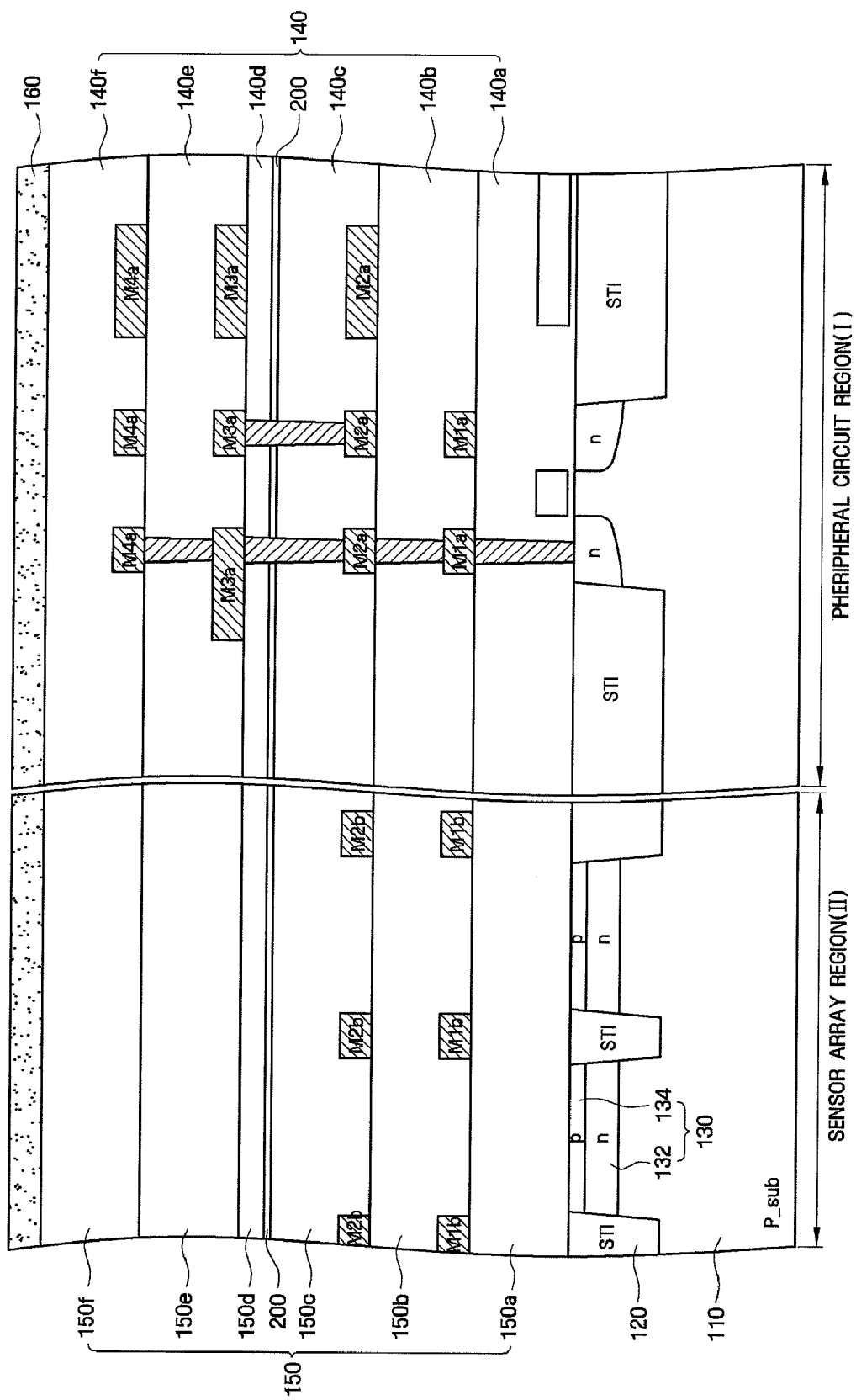

Referring to FIG. 6A, the element isolation area 120 is formed in the substrate 110 to define the peripheral circuit region I and the sensor array region II.

Then, the photoelectric conversion elements 130 are formed in the sensor array region II. A plurality of read elements are formed in the sensor array region II, and a plurality of CMOS elements are formed in the peripheral circuit region I.

Subsequently, the first insulating film structure 140 including the first multi-layer wiring lines M1a, M2a, M3a, and M4a, a plurality of vias (for example, 141) that electrically connect the first multi-layer wiring lines M1a, M2a, M3a, and M4a, and a plurality of interlayer insulating films 140a, 140b, 140c, 140d, 140e, and 140f is formed on the peripheral circuit region I. The second insulating film structure 150 including the second multi-layer wiring lines M1b and M2b, a plurality of vias that electrically connect the second multi-layer wiring lines M1b and M2b, and a plurality of interlayer insulating films 150a, 150b, 150c, 150d, 150e, and 150f is formed on the sensor array region II. The first insulating film structure 140 and the second insulating film structure 150 may be formed at the same time.

In particular, as shown in FIG. 6A, the isotropic etch-stop layers 200 are formed in the first insulating film structure 140 and the second insulating film structure 150. The isotropic etch-stop layer 200 may be formed between the second-layer wiring lines M2a and the third-layer wiring lines M3a, but the exemplary embodiments of the invention are not limited thereto.

The vias 141 that connect the second-layer wiring lines M2a and the third-layer wiring lines M3a may be formed so as to pass through the isotropic etch-stop layer 200, as shown in FIG. 6A. A method of forming the vias 141 will be described below with reference to FIGS. 7A to 7E, and FIGS. 8A and 8B.

Then, the passivation layer 160 is formed on the first insulating film structure 140 and the second insulating film structure 150.

Figure 6B:
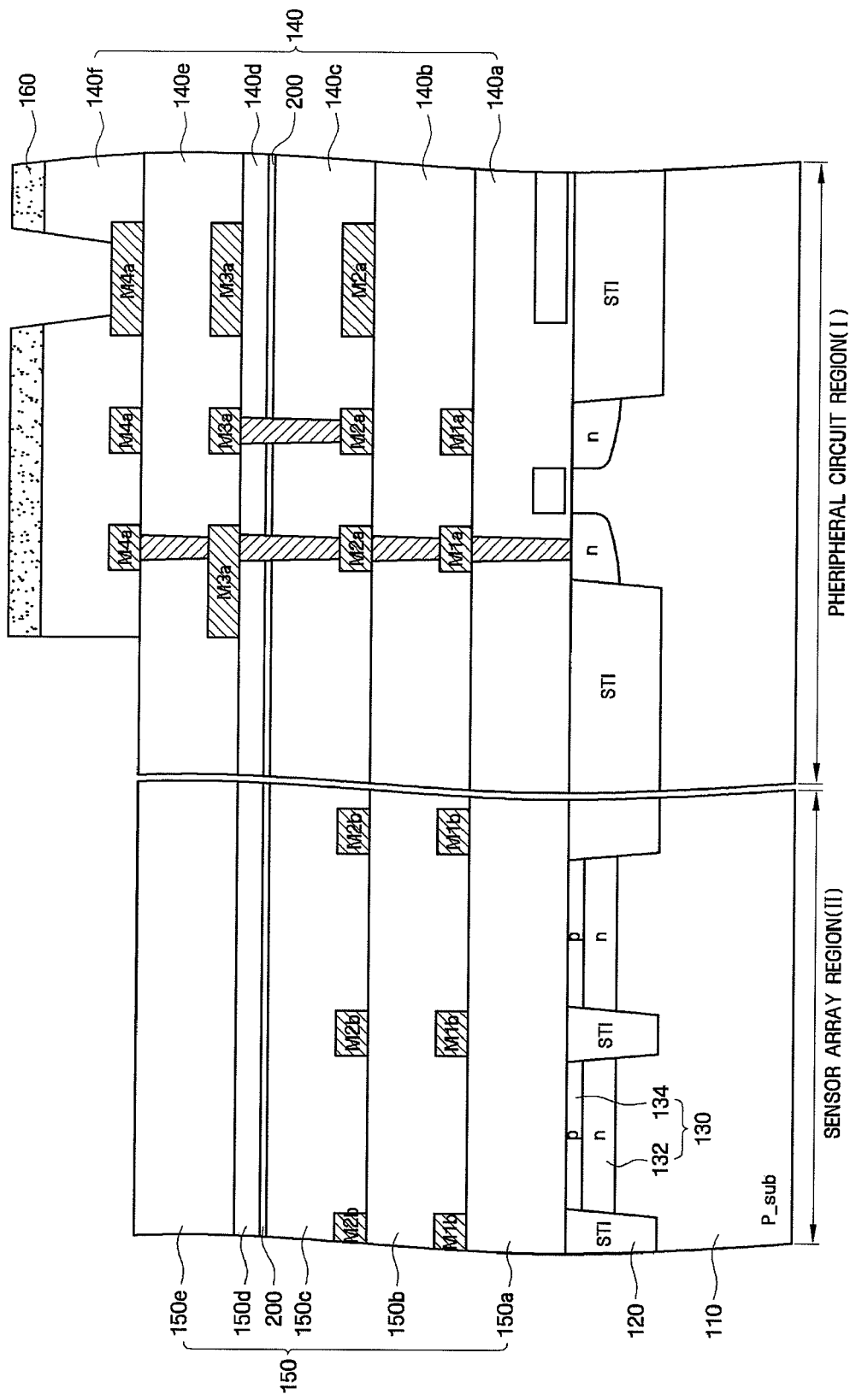

Referring to FIG. 6B, anisotropic etching is used to remove the passivation layer 160 formed on the second insulating film structure 150.

Some of the plurality of fourth-layer wiring lines M4a in the first insulating film structure 140 serve as signal input/output pads. The anisotropic etching makes it possible to exposure the pads from the first insulating film structure 140 while removing the passivation layer 160 formed on the second insulating film structure 150.

It will be understood by those skilled in the art that the process of removing the passivation layer 160 formed on the second insulating film structure 150 is separately performed from the process of exposing the pads from the second insulating film structure 150.

Referring to FIG. 6C, the isotropic etching is used to remove some interlayer insulating films 150d, 150e, and 150f in the second insulating film structure 150. That is, the interlayer insulating films 150d, 150e, and 150f on the isotropic etch-stop layer 200 removed from the second insulating film structure 150.

This is to increase the quantity of light incident on the photoelectric conversion element 130, thereby improving the sensitivity of the image sensor, as described above. In recent years, with an increase in the number of layers including the first multi-layer wiring lines M1a, M2a, M3a, and M4a in the peripheral circuit region I, the difference between the number of layers including the first multi-layer wiring lines M1a, M2a, M3a, and M4a in the peripheral circuit region I and the number of layers including the second multi-layer wiring lines M1b and M2b in the sensor array region II has increased. As shown in FIG. 6C, for example, the number of layers including the first multi-layer wiring lines M1a, M2a, M3a, and M4a is four, and the number of layers including the second multi-layer wiring lines M1b and M2b are two. Therefore, when a thick film is formed on the photoelectric conversion element 130, the quantity of light incident on the photoelectric conversion element 130 may be reduced, and thus various optical characteristics may deteriorate. Therefore, in this exemplary embodiment of the invention, the isotropic etching is used to remove some unnecessary interlayer insulating films 150d, 150e, and 150f in the second insulating film structure 150.

In this exemplary embodiment, the aspect ratio r is defined as the ratio of the height h of the second insulating film structure 150 to the width w of the photoelectric conversion element 130 (that is, r=h/w), and the RI (relative intensity) value is defined as the ratio of the sensitivity of the unit pixel in a central region of the sensor array region II to the sensitivity of the unit pixel in the outermost region. In this case, unlike the above-mentioned embodiment of the invention, when anisotropic etching is used to remove unnecessary interlayer insulating films 150d, 150e, and 150f, a variation in the height h increases, and the quantity of light incident on the photoelectric conversion element 130 is reduced, which results in a decrease in the RI value. In addition, the image sensor may be damaged by plasma during the isotropic etching, and the amount of dark current may increase. For example, the plasma may cause a positive charge to be stored in the gate of the transmission element 15, and the positive charge may cause a negative charge to be stored in the channel area of the transmission element 15. However, as in the above-described exemplary embodiment, when isotropic etching is used to remove unnecessary interlayer insulating films in the sensor array region II, it is possible to reduce the damage of the image sensor due to the plasma, and considerably decrease the variation in the height h, which may result in an increase in the RI value. Therefore, it is possible to improve the optical characteristics of an image sensor.

Figure 6D:
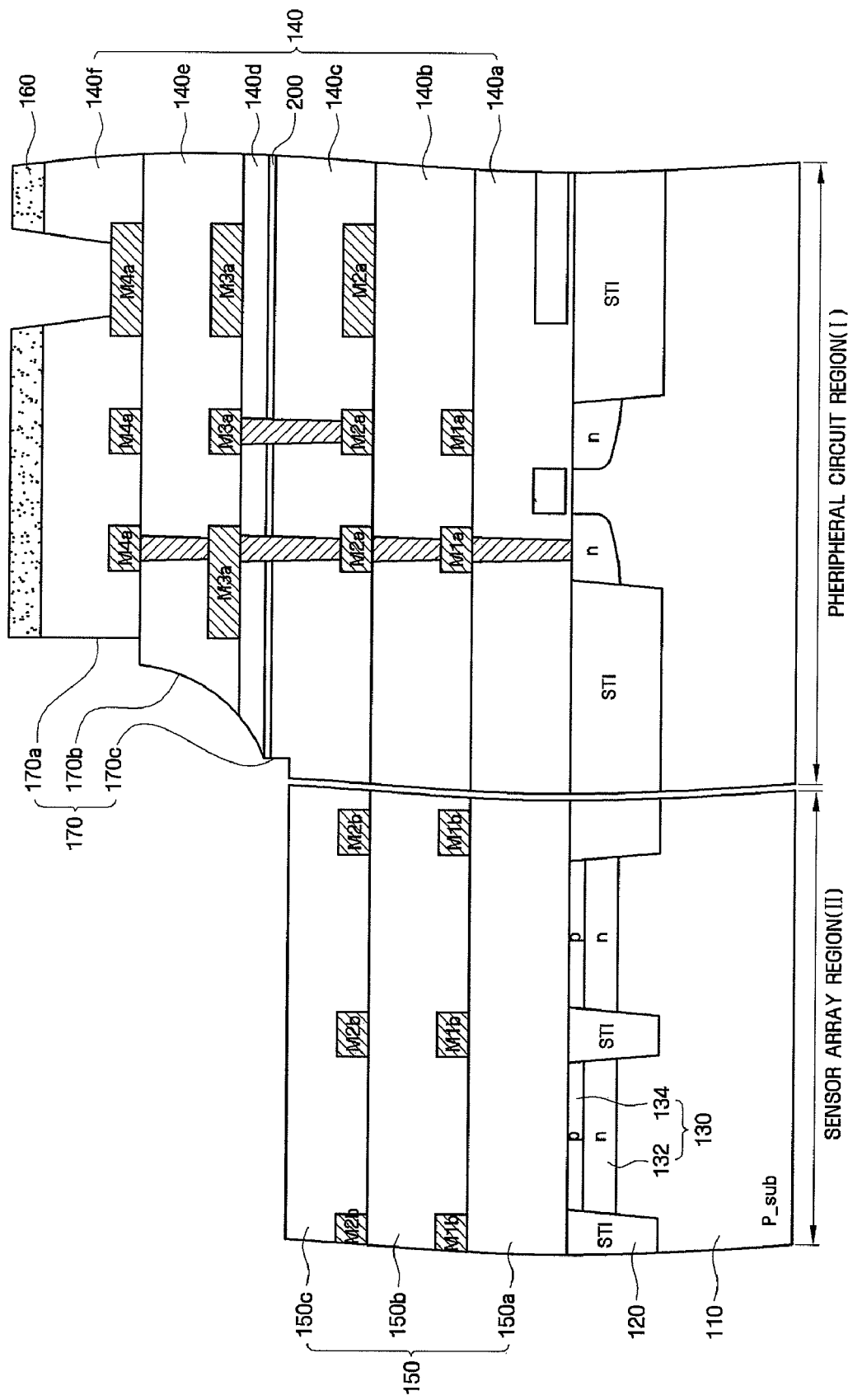

Referring to FIG. 6D, the anisotropic etching is used to remove the isotropic etch-stop layer 200 in the second insulating film structure 150.

This is to increase the quantity of light incident on the sensor array region II, thereby improving the sensitivity of the image sensor. That is, as described above, the isotropic etch-stop layer 200 may be formed of a nitride film (for example, PSiN). The nitride film is opaque and absorbs or reflects light incident on the sensor array region II. When the isotropic etch-stop layer 200 is positioned on the sensor array region II, the quantity of light incident on the sensor array region II may be reduced. Therefore, it is preferable to remove the isotropic etch-stop layer 200 from the second insulating film structure 150.

Referring to FIG. 2, the color filters 180, the planarizing film 185, and the micro lenses 190 are sequentially formed on the second upper surface of the second insulating film structure 150. The planarizing film 185 may be formed so as to extend up to the first upper surface of the first insulating film structure 140.

Next, a method of forming the vias 141 will be described with reference to FIGS. 7A to 7E and FIGS. 8A and 8B. FIGS. 7A to 7E show an example of using an ArF photoresist film (that is, a photolithography process using an ArF exposure light source), and FIGS. 8A and 8B show an example of using a KrF photoresist film (that is, a photolithography process using a KrF exposure light source). As the ArF exposure light source has higher resolution than the KrF exposure light source, the thickness of the ArF photoresist film is smaller than that of the KrF photoresist film. Therefore, when the ArF exposure light source is used to form the vias, a hard mask film is used (since the ArF photoresist film is thin). When the KrF exposure light source is used to form the vias, the hard mask film may not be used (since the KrF photoresist film is sufficiently thick).

First, the example of using the ArF photoresist film will be described with reference to FIGS. 7A to 7E.

Figure 7A:
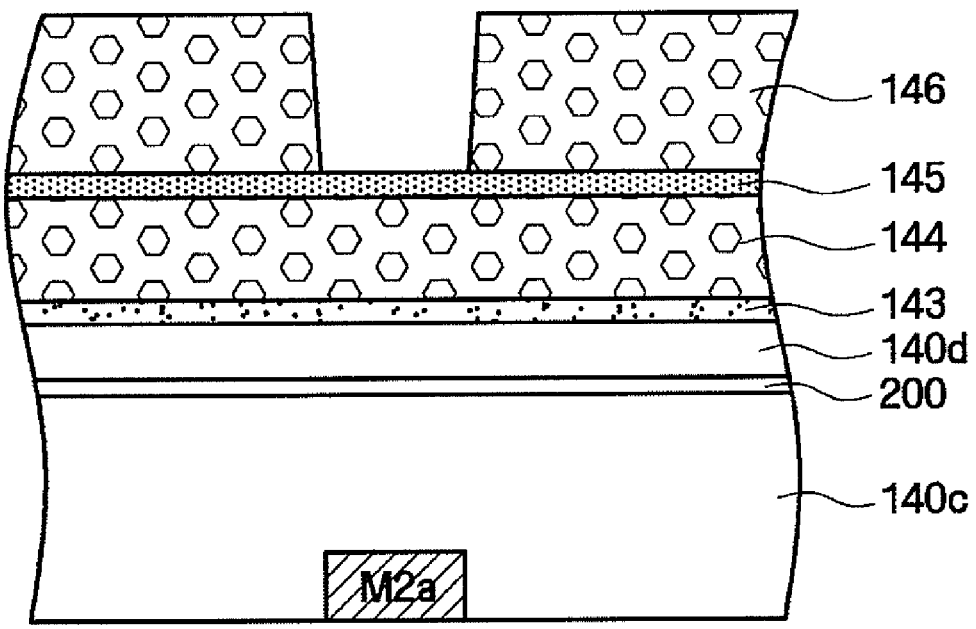
FIGS. 7A to 7E and FIGS. 8A and 8B are cross-sectional views illustrating in detail the intermediate processes of the method of manufacturing an image sensor according to an exemplary embodiment of the present invention.
Figure 8A:
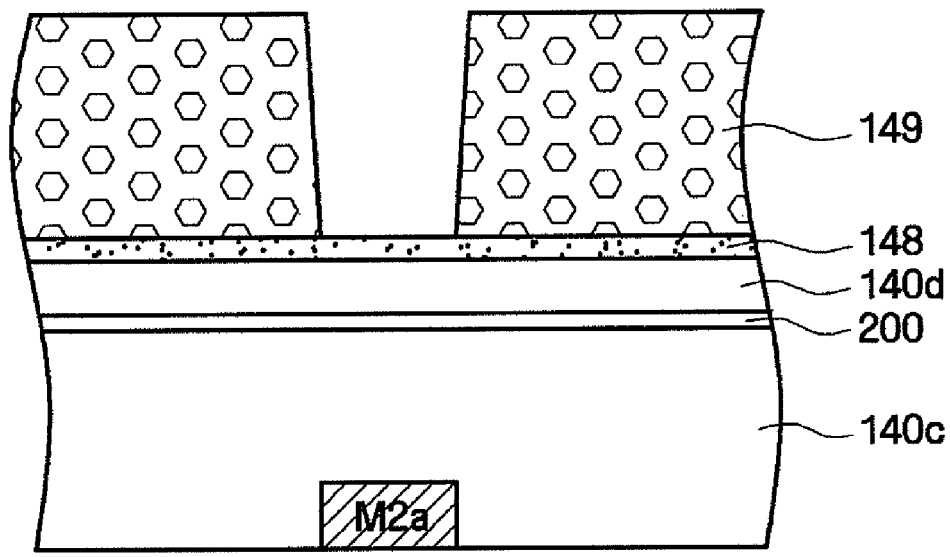
Figure 8B:
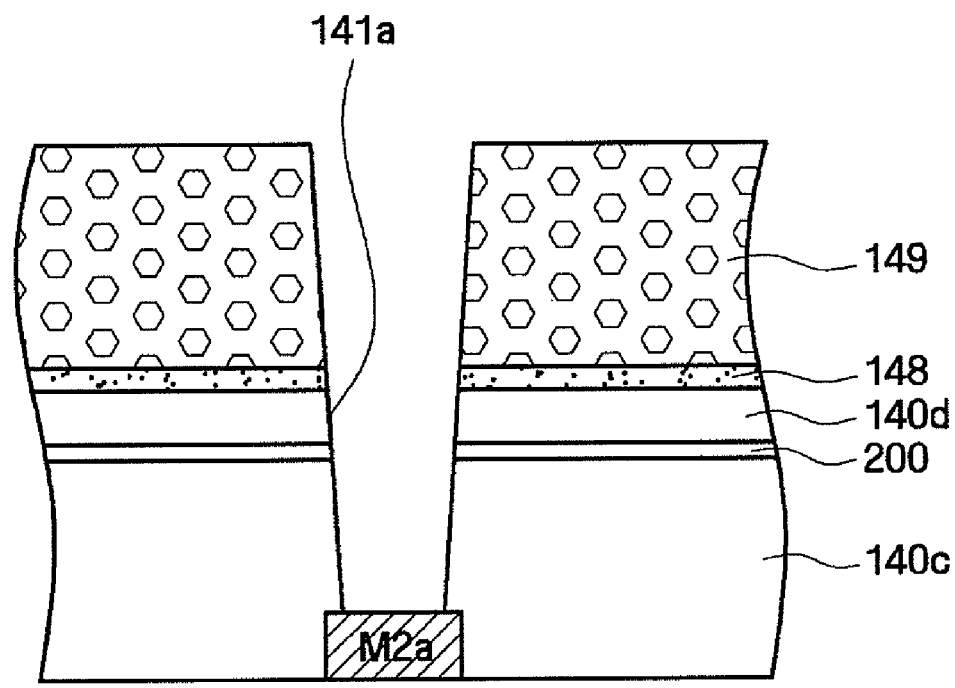

Referring to FIG. 7A, the lower interlayer insulating film 140c, the isotropic etch-stop layer 200, the upper interlayer insulating film 140d, a first hard mask film 143, a second hard mask film 144, an anti-reflection film 145, and an ArF photoresist film 146 are sequentially formed on the second-layer wiring lines M2a.

For example, the first hard mask film 143 may be a nitride film (for example, PSiN), the second hard mask film 144 may be an amorphous carbon layer (ACL), and the anti-reflection film 145 may be an oxynitride film (for example, SiON). The ArF photoresist film 146 may have a thickness of, for example, about 2000 Å. The reason why a polymer-based ACL is used as the second hard mask film 144 is to simultaneously remove the ArF photoresist film 146 and the second hard mask film 144 using an ashing process.

Figure 7B:
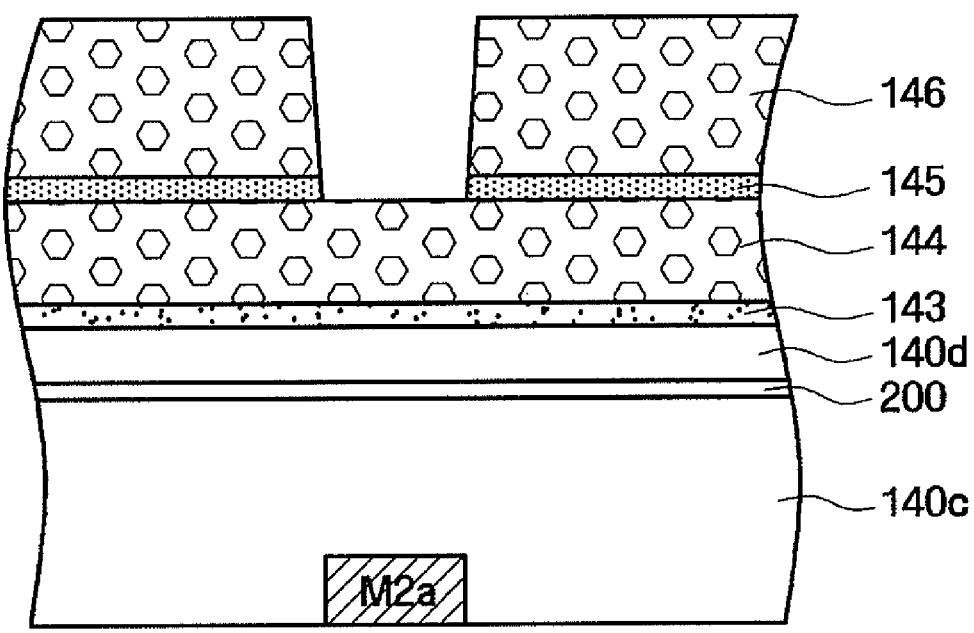

Referring to FIG. 7B, the ArF photoresist film 146 is used to pattern the anti-reflection film 145.

Figure 7C:
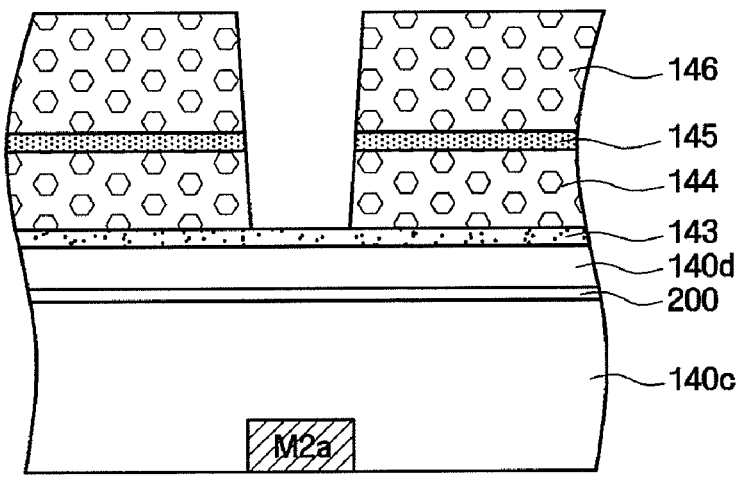

Referring to FIG. 7C, the second hard mask film 144 is patterned.

Figure 7D:
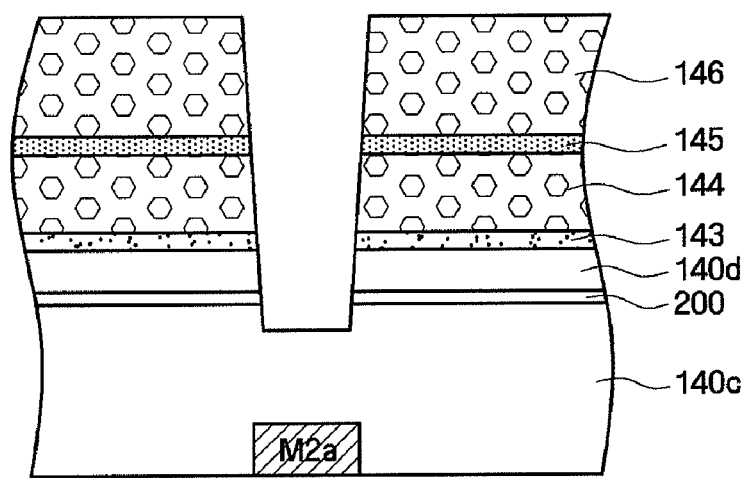

Referring to FIG. 7D, the first hard mask film 143, the upper interlayer insulating film 140d, and the isotropic etch-stop layer 200 are etched.

Figure 7E:
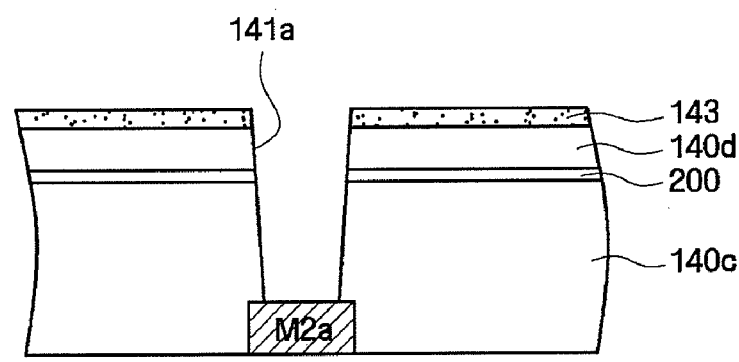

Referring to FIG. 7E, the ashing process is performed to remove the ArF photoresist film 146, the anti-reflection film 145, and the second hard mask film 144.

Then, etching is performed using the remaining first hard mask film 143 such that the second-layer wiring lines M2a are exposed, thereby completing via holes 141a.

The via holes 141a are filled with a conductive material, such as, for example, tungsten, to form vias.

Next, the example of using the KrF photoresist film will be described with reference to FIGS. 8A and 8B.

Referring to FIG. 8A, the lower interlayer insulating film 140c, the isotropic etch-stop layer 200, the upper interlayer insulating film 140d, a hard mask film 148, and a KrF photoresist film 149 are sequentially formed on the second-layer wiring lines M2a. The hard mask film 148 may be, for example, a nitride film (for example, PSiN). The hard mask film 148 may not be used according to the design. The KrF photoresist film 149 may have a thickness of, for example, about 5000 Å.

Referring to FIG. 8B, the KrF photoresist film 149 is used to pattern the hard mask film 148, the upper interlayer insulating film 140d, the isotropic etch-stop layer 200, and the lower interlayer insulating film 140c, thereby forming the via holes 141a.

Figure 9A:
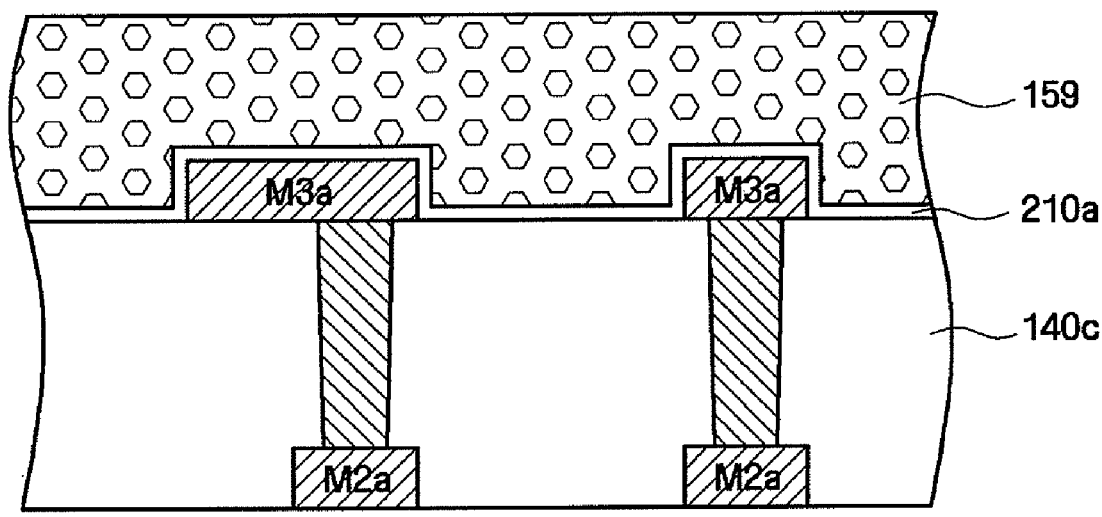
FIGS. 9A and 9B are cross-sectional views illustrating intermediate processes of a method of manufacturing an image sensor according to an exemplary embodiment of the present invention.
Figure 9B:
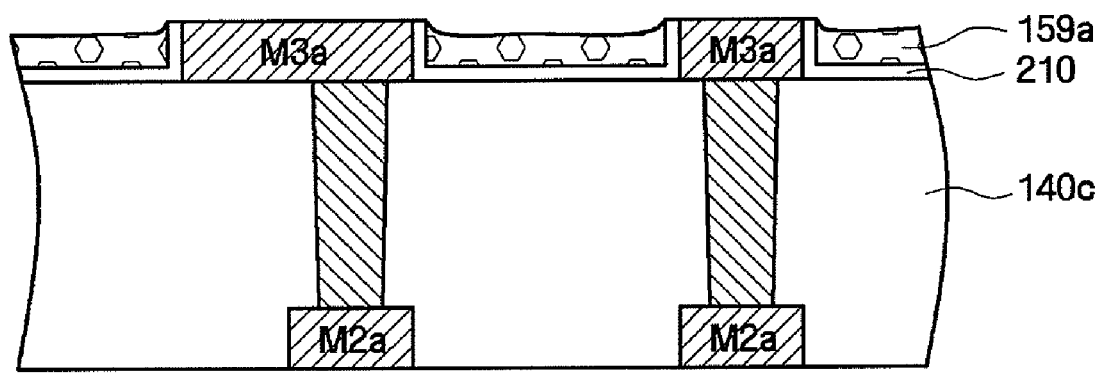

FIGS. 9A and 9B are cross-sectional views illustrating intermediate processes of a method of manufacturing an image sensor according to another exemplary embodiment of the invention. The present exemplary embodiment differs from the above-described embodiment in that an isotropic etch-stop layer 210 is formed so as to contact with the third-layer wiring lines M3a. For example, the isotropic etch-stop layer 210 may be formed on the upper surface of the interlayer insulating film 140c and the side surfaces of the third-layer wiring lines M3a. Next, a method of forming the isotropic etch-stop layer 210 will be described with reference to FIGS. 9A and 9B.

Referring to FIG. 9A, the isotropic etch-stop layer 210a is conformally formed on the interlayer insulating film 140c having the third-layer wiring lines M3a formed therein. That is, the isotropic etch-stop layer 210a is formed on the upper surface of the interlayer insulating film 140c, and the upper and side surfaces of each of the third-layer wiring lines M3a.

Then, a photoresist 159 is formed on the isotropic etch-stop layer 210a. The photoresist 159 fills up a space between adjacent third-layer wiring lines M3a.

Referring to FIG. 9B, for example, a chemical mechanical polishing (CMP) process or an etchback process is performed to remove the isotropic etch-stop layer 210a formed on the upper surface of each of the third-layer wiring lines M3a. Therefore, the isotropic etch-stop layer 210 is formed on the upper surface of the interlayer insulating film 140*c*, and the upper and side surfaces of each of the third-layer wiring lines M3*a*.

Then, the remaining photoresist 159 is removed.

Successively, the interlayer insulating film 140*f* is formed on the third-layer wiring lines M3*a* and the isotropic etch-stop layer 210. As the subsequent processes according to the present exemplary embodiment are the same as those according to the above-described embodiment of the invention, a description thereof will be omitted.

The reason why the isotropic etch-stop layer 210*a* formed on the upper surface of each of third-layer wiring lines is removed and then the interlayer insulating film 140*f* is formed is to readily form the vias on the third-layer wiring lines M3*a*. That is, when an interlayer insulating film is formed on the isotropic etch-stop layer 210*a* that remains on the upper surfaces of the third-layer wiring lines M3*a*, the process of forming the via holes on the third-layer wiring lines M3*a* may become complicated.

Details of the invention will be described by way of the following experimental examples. Since content described herein can be technically considered by those skilled in the art, a description thereof will be omitted.

Experimental Example 1

In Comparative experimental example 1, as shown in FIG. 6A, an intermediate structure was formed, and unnecessary interlayer insulating films (that is, the interlayer insulating films 150*d*, 150*e*, and 150*f* in FIG. 6A) formed on the sensor array region were removed only by the anisotropic etching process. Then, the height of the insulating film structure formed on the sensor array region was measured.

In Experimental examples 1 and 2, as shown in FIG. 6A, an intermediate structure was formed, and unnecessary interlayer insulating films (that is, the interlayer insulating films 150*d*, 150*e*, and 150*f* in FIG. 6A) formed on the sensor array region were at least partially removed only by the isotropic etching process. Then, the height of the insulating film structure formed on the sensor array region was measured. Anisotropic etching (see FIG. 6B), isotropic etching (see FIG. 6C), anisotropic etching (see FIG. 6D) were sequentially performed on the unnecessary interlayer insulating films.

Figure 10:
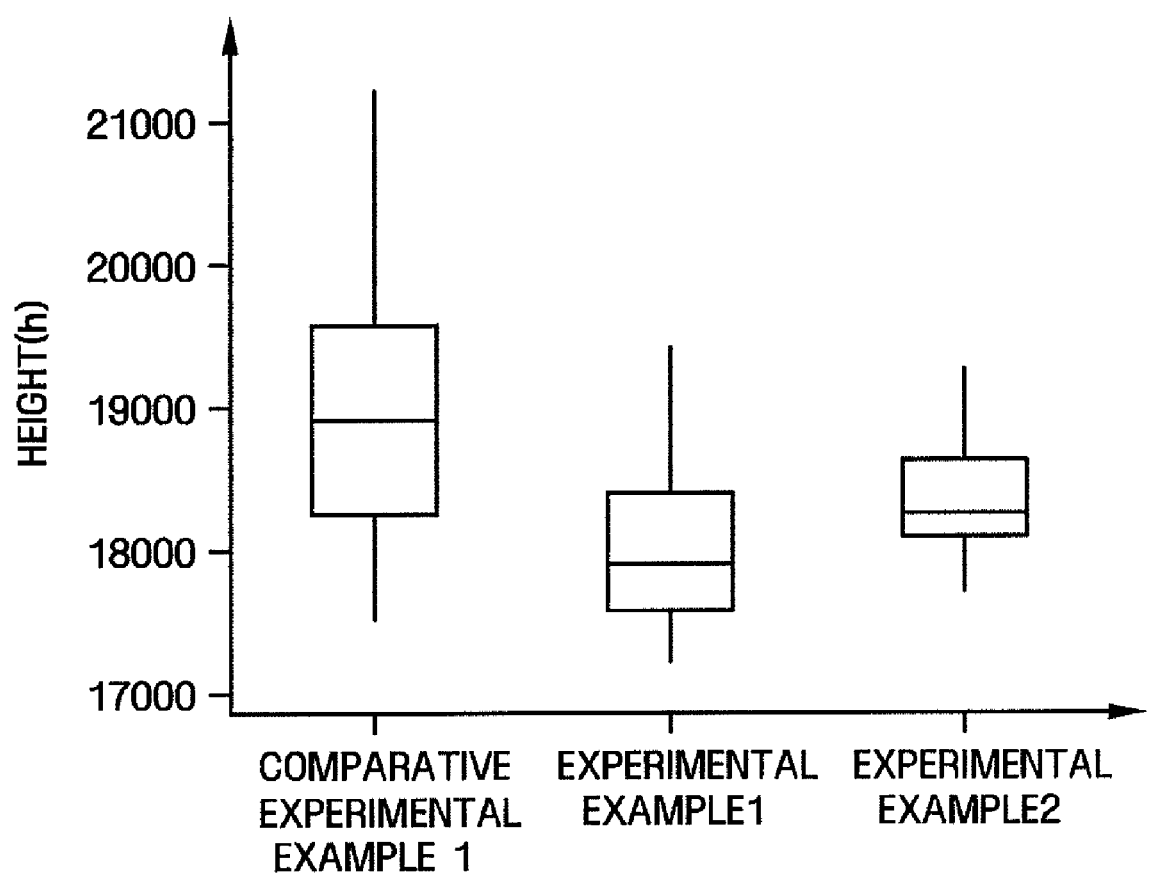
FIG. 10 is a graph illustrating the comparison result between the height of an insulating film structure measured after only anisotropic etching is used to remove unnecessary interlayer insulating films formed on a sensor array region and the height of an insulating film structure measured after isotropic etching is used to remove unnecessary interlayer insulating films formed on the sensor array region.

The results are shown in Table 1 and FIG. 10. Table 1 shows, for example, the averages, medians, maximum values, minimum values, standard deviations, and ranges of Comparative experimental example 1 and Experimental examples 1 and 2. FIG. 10 shows a box plot, in which a center line indicates the median.

Referring to Table 1 and FIG. 10, comparing the averages, the average of Experimental example 1 is about 1062 Å smaller than that of Comparative experimental example 1, and the average of Experimental example 2 is about 824 Å smaller than that of Comparative experimental example 1.

The standard deviation of Experimental example 1 increased about 40.7%, compared to the standard deviation of Comparative experimental example 1 (∵ about 1−about 490/about 826=about 0.407). The standard deviation of Experimental example 2 increased about 41.4%, compared to the standard deviation of Comparative experimental example 1 (∵ about 1−about 484/about 826=about 0.414).

The range is a value corresponding to the difference between the maximum value and the minimum value. The range of Experimental example 1 increased about 46%, compared to the range of Comparative experimental example 1 (∵ about 1−about 2011/about 3724=about 0.460). The range of Experimental example 2 increased about 46.6%, compared to the range of Comparative experimental example 1 (∵ about 1−about 1988/about 3724=about 0.466).

TABLE 1

|  | Comparative experimental example 1 | Experimental example 1 | Experimental example 2 |
| --- | --- | --- | --- |
| Average (AVG) | about 19044 | about 17982 | about 18220 |
| Median (MEDIAN) | about 18923 | about 17817 | about 18090 |
| Minimum value (MIN) | about 17615 | about 17234 | about 17588 |
| Maximum value (MAX) | about 21339 | about 19245 | about 19576 |
| Standard deviation (STD) | about 826 | about 490 | about 484 |
| Range (RANGE) | about 3724 | about 2011 | about 1988 |

Experimental Example 2

In Comparative experimental example 2, as shown in FIG. 6A, an intermediate structure was formed, and then unnecessary interlayer insulating films (that is, the interlayer insulating films 150*d*, 150*e*, and 150*f* in FIG. 6A) formed on the sensor array region were removed only by the anisotropic etching process.

In Experimental example 3, as shown in FIG. 6A, an intermediate structure was formed, and unnecessary interlayer insulating films (that is, the interlayer insulating films 150*d*, 150*e*, and 150*f* in FIG. 6A) formed on the sensor array region were at least partially removed only by the isotropic etching process. That is, anisotropic etching (see FIG. 6B), isotropic etching (see FIG. 6C), anisotropic etching (see FIG. 6D) were sequentially performed on the unnecessary interlayer insulating films.

Then, the sensitivity of the unit pixels receiving red light in Comparative experimental example 2 was measured, and the sensitivity of the unit pixels receiving red light in Experimental example 3 was measured.

Figure 11:
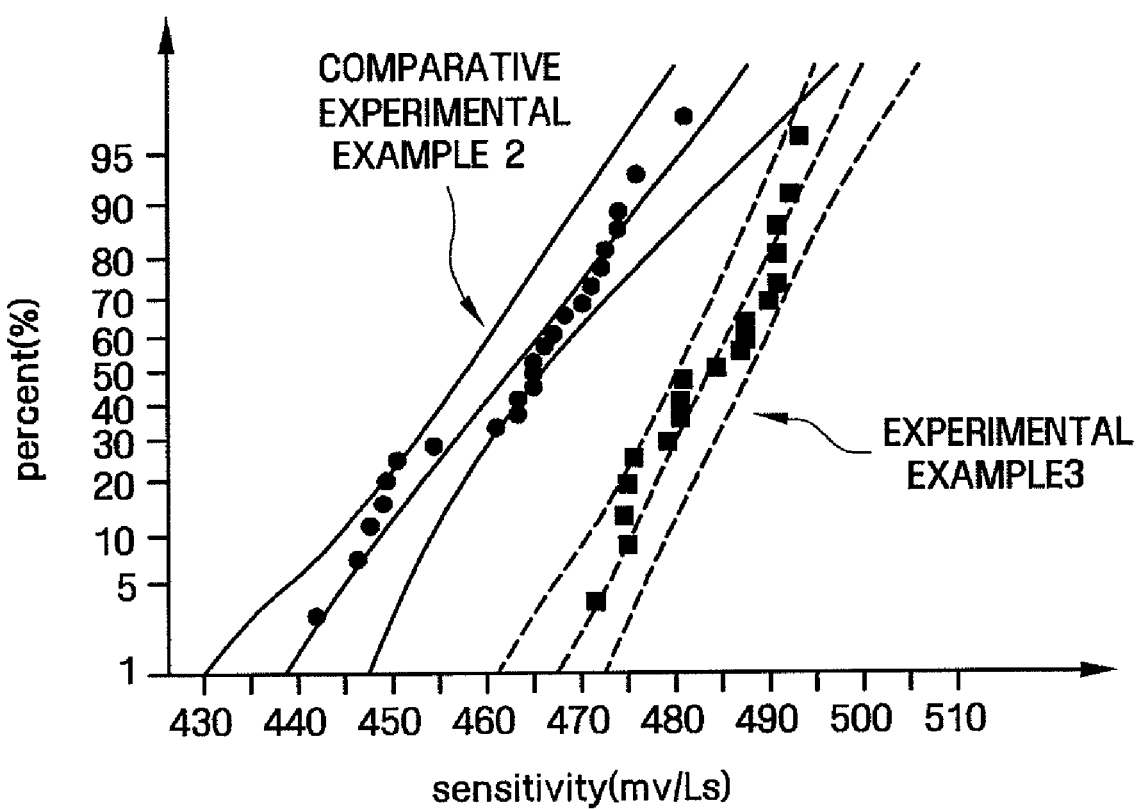
FIG. 11 is a graph illustrating the comparison result between the sensitivity of a unit pixel measured after only anisotropic etching is used to remove unnecessary interlayer insulating films formed on the sensor array region and the sensitivity of a unit pixel measured after isotropic etching is used to remove unnecessary interlayer insulating films formed on the sensor array region.

The results are shown in Table 2 and FIG. 11. In FIG. 11, an x-axis indicates the sensitivity (mV/Ls), and a y-axis indicates a cumulative percent (%).

Referring to FIGS. 2 and 11, the average of Experimental example 3 increased about 4.4%, compared to the average of Comparative experimental example 2 (∵ about 483.3/about 463.3=about 1.044).

The standard deviation of Experimental example 3 increased about 33.6%, compared to the standard deviation of Comparative experimental example 2 (∵ about 1−about 7.07/about 10.65=about 0.336).

TABLE 2

|  | Comparative experimental example 2 | Experimental example 3 |
| --- | --- | --- |
| Average (AVG) | about 463.3 | about 483.8 |
| Standard deviation (STD) | about 10.65 | about 7.07 |

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. An image sensor comprising:
a substrate having a sensor array region and a peripheral circuit region;

a first insulating film structure formed on the peripheral circuit region, the first insulating film structure including a plurality of first multi-layer wiring lines;

a second insulating film structure formed on the sensor array region, the second insulating film structure including a plurality of second multi-layer wiring lines, wherein an uppermost-layer wiring line of the plurality of first multi-layer wiring lines is higher than that of an uppermost-layer wiring line of the plurality second multi-layer wiring lines, the first insulating film structure includes an isotropic etch-stop layer, and the second insulating film structure does not include the isotropic etch-stop layer; and a planarizing film formed on a first upper surface of the first insulating film structure and on a second upper surface of the second insulating film structure, wherein:

the first upper surface of the first insulating film structure is higher than the second upper surface of the second insulating film structure; and at least a portion of a connecting surface that connects the first upper surface and the second upper surface has an isotropic etching profile and wherein the connecting surface includes a first portion contacting the first upper surface, a second portion contacting the second upper surface, and a third portion having a curved shape formed between the first portion and the second portion.

2. The image sensor of claim 1, wherein the isotropic etch-stop layer is higher than the uppermost-layer wiring line of the second multi-layer wiring lines.

3. The image sensor of claim 1, wherein the isotropic etch-stop layer is formed between n-th (n is a natural number that is equal to or greater than 1) layer wiring lines and (n+1)-th layer wiring lines among the plurality of first multi-layer wiring lines.

4. The image sensor of claim 3, wherein the isotropic etch-stop layer does not contact the n-th layer wiring lines and the (n+1)-th layer wiring lines.

5. The image sensor of claim 4, wherein:

the first insulating film structure further includes a lower interlayer insulating film and an upper interlayer insulating film that are formed between the n-th layer wiring lines and the (n+1)-th layer wiring lines; and the isotropic etch-stop layer is formed between the lower interlayer insulating film and the upper interlayer insulating film.

6. The image sensor of claim 5, wherein:

the first insulating film structure includes vias that electrically connect the n-th layer wiring lines and the (n+1)-th layer wiring lines; and the vias are formed so as to pass through the isotropic etch-stop layer.

7. The image sensor of claim 3, wherein the isotropic etch-stop layer is formed between second-layer wiring lines and third-layer wiring lines, or between the third-layer wiring lines and fourth-layer wiring lines.

8. The image sensor of claim 1, further comprising:

a plurality of photoelectric conversion elements formed in the sensor array region; and a plurality of color filters and a plurality of micro lenses formed on areas of the second upper surface of the second insulating film structure that correspond to the plurality of photoelectric conversion elements and wherein a portion of the planarizing film is located between the plurality of color filters and the plurality of micro lenses.

9. The image sensor of claim 1, wherein the plurality of first and second multi-layer wiring lines are formed of aluminum.

10. The image sensor of claim 1, wherein the isotropic etch-stop layer is a nitride film.

11. An image sensor comprising:

a substrate having a sensor array region and a peripheral circuit region;

a first insulating film structure formed on the peripheral circuit region, the first film insulating film structure including a plurality of first multi-layer wiring lines; and a second insulating film structure formed on the sensor array region, the second insulating film structure including a plurality of second multi-layer wiring lines, wherein a first upper surface of the first insulating film structure is higher than a second upper surface of the second insulating film structure, and at least a portion of a connecting surface that connects the first upper surface and the second upper surface has an isotropic etching profile, wherein the connecting surface includes a first portion contacting the first upper surface, a second portion contacting the second upper surface, and a third portion having a curved shape formed between the first portion and the second portion, wherein the first insulating film structure includes an isotropic etch-stop layer; and the second insulating film structure does not include the isotropic etch-stop layer, and wherein the isotropic etch-stop layer is formed between n-th (n is a natural number that is equal to or greater than 1) layer wiring lines and (n+1)-th layer wiring lines among the plurality of first multi-layer wiring lines.

12. The image sensor of claim 11, wherein a portion of the connecting surface contacting the first upper surface has an anisotropic etching profile.

13. The image sensor of claim 11, wherein another portion of the connecting surface contacting the second upper surface has an anisotropic etching profile.

14. The image sensor of claim 11, further comprising:

a planarizing film formed on the first upper surface of the first insulating film structure and on the second upper surface of the second insulating film structure.

* * * * *